(12) United States Patent
Cheung

(10) Patent No.: US 8,942,248 B1
(45) Date of Patent: Jan. 27, 2015

(54) SHARED CONTROL LOGIC FOR MULTIPLE QUEUES

(75) Inventor: Colman C. Cheung, San Diego, CA (US)

(73) Assignee: Altera Corporation, San Jose, CA (US)

( * ) Notice: Subject to any disclaimer, the term of this patent is extended or adjusted under 35 U.S.C. 154(b) by 502 days.

(21) Appl. No.: 12/762,987

(22) Filed: Apr. 19, 2010

(51) Int. Cl.
*H04L 12/54* (2013.01)
*H04L 7/00* (2006.01)
*G11C 7/22* (2006.01)

(52) U.S. Cl.
CPC .............. *H04L 7/0041* (2013.01); *G11C 7/22* (2013.01)
USPC ....................................................... 370/412

(58) Field of Classification Search
CPC ...................................................... H04L 7/0041
See application file for complete search history.

(56) References Cited

U.S. PATENT DOCUMENTS

| | | | | |
|---|---|---|---|---|
| 5,321,754 A * | 6/1994 | Fisher et al. | ................... | 380/268 |
| 5,594,702 A * | 1/1997 | Wakeman et al. | ....... | 365/230.05 |
| 5,961,640 A * | 10/1999 | Chambers et al. | ............ | 712/300 |
| 6,055,616 A * | 4/2000 | Panwar | ......................... | 711/170 |
| 6,144,604 A * | 11/2000 | Haller et al. | ................... | 365/221 |
| 6,188,381 B1 * | 2/2001 | van der Wal et al. | ......... | 345/581 |
| 6,427,196 B1 * | 7/2002 | Adiletta et al. | ............... | 711/158 |
| 6,584,578 B1 * | 6/2003 | Faue | ............. | 713/503 |
| 6,647,484 B1 * | 11/2003 | Jiang et al. | .................... | 711/220 |
| 7,080,169 B2 * | 7/2006 | Tang et al. | ...................... | 710/52 |
| 7,131,093 B1 * | 10/2006 | Aden | ............................ | 716/108 |
| 7,190,753 B2 * | 3/2007 | Zielbauer | ...................... | 375/371 |
| 7,216,247 B2 * | 5/2007 | Heragu et al. | ................ | 713/401 |
| 7,278,008 B1 * | 10/2007 | Case et al. | ..................... | 711/209 |
| 7,346,739 B1 * | 3/2008 | Conover et al. | ............... | 711/131 |
| 7,373,437 B2 * | 5/2008 | Seigneret et al. | ............... | 710/22 |
| 7,590,008 B1 * | 9/2009 | Roge et al. | ............. | 365/189.011 |
| 7,603,496 B2 * | 10/2009 | Wrigley et al. | ................. | 710/52 |
| 7,630,389 B1 * | 12/2009 | Alfieri et al. | .................... | 370/412 |
| 7,681,018 B2 * | 3/2010 | Wolrich et al. | ............... | 712/225 |
| 7,983,094 B1 * | 7/2011 | Roge et al. | ............. | 365/189.011 |
| 7,995,622 B1 * | 8/2011 | Fagerlund et al. | ............ | 370/504 |
| 8,073,090 B2 * | 12/2011 | Zhang et al. | .................. | 375/362 |
| 8,107,457 B2 * | 1/2012 | White et al. | .................. | 370/350 |
| 8,121,237 B2 * | 2/2012 | Stott et al. | ...................... | 375/355 |
| 8,407,441 B2 * | 3/2013 | Giovannini et al. | .......... | 711/167 |
| 2006/0018170 A1 * | 1/2006 | Au et al. | ....................... | 365/205 |
| 2007/0064588 A1 * | 3/2007 | Kisoda et al. | ................. | 370/208 |

* cited by examiner

*Primary Examiner* — Gregory Sefcheck
(74) *Attorney, Agent, or Firm* — Womble, Carlyle, Sandridge & Rice

(57) ABSTRACT

Methods, integrated circuits, and computer programs for managing a communication path carrying multiple channels are presented. Each channel includes a first-in first-out (FIFO) queue. In one method, the time difference between the start of a cycle for receiving data in a particular channel and a start of a cycle for transmitting data in the same particular channel is identified. Further, the method includes an operation for buffering arriving data in the communication path. The arriving data is buffered for an amount of time equal to the identified time difference, and the result is delayed data. FIFO registers are loaded from memory, which includes loading FIFO control and status data for a single FIFO queue, where the single FIFO queue is associated with the current channel of the produced delayed data at any time. Additionally, method includes an operation for processing contemporaneously read and write requests for the single FIFO queue using the loaded FIFO registers.

20 Claims, 8 Drawing Sheets

# SHARED CONTROL LOGIC FOR MULTIPLE QUEUES

BACKGROUND

Time-division multiplexing (TDM) is a type of digital multiplexing in which two or more signals or bit streams are transferred apparently simultaneously as sub-channels in one communication channel, but are physically taking turns on the channel. The time domain is divided into several recurrent timeslots of fixed length, one for each sub-channel.

Some implementations of a channelized communication environment use First-In First-Out (FIFO) queues to buffer the data of each channel. When the transmission rates, the data arrival times, or the data request times are different or independent, a FIFO is used to buffer the data in each channel. When the channel processing is performed by a single Integrated Circuit (IC), it is easy to share a block of Random Access Memory (RAM) for all FIFO data, but each channel has separate FIFO controls for processing the data. If the FIFO control data is stored in the IC's logic registers, the number of registers needed to manage the FIFO queues grows linearly with the number of channels.

As modern telecommunication links grow in speed and capacity, the number of channels sharing a given path can grow into the hundreds or thousands, or even more. For example, base stations handling mobile communications can share one land line to handled hundreds or thousands of phone conversations. Implementing a large number of FIFO queues requires a large number of logic registers in the IC for managing these complex multi-channel communication links.

It is in this context that embodiments of the invention arise.

SUMMARY

Embodiments of the present invention provide methods, Integrated Circuits (IC), and computer programs for managing a communication path carrying multiple channels. It should be appreciated that the present invention can be implemented in numerous ways, such as a process, an apparatus, a system, a device or a method on a computer readable medium. Several inventive embodiments of the present invention are described below.

In one embodiment, a method for managing a communication path carrying multiple channels, where each channel includes a First-In First-Out (FIFO) queue is presented. In the method, the time difference between the start of the cycle for receiving data in a particular channel and the start of a cycle for transmitting data in the same particular channel is identified. Further, the method includes an operation for buffering arriving data in the communication path. The arriving data is buffered for an amount of time equal to the identified time difference to produce delayed data. FIFO registers are loaded from memory, which includes FIFO control and status data for a single FIFO queue, where the single FIFO queue is associated with the current channel of the produced delayed data at any time. Additionally, the method includes an operation for processing contemporaneously read and write requests for the single FIFO queue using the loaded FIFO registers.

In another embodiment, a system for managing a communication path carrying multiple channels in an IC is presented, where each channel includes a FIFO queue. The system includes a buffer, channel control memory, and a FIFO logic module. The buffer is used to delay arriving data in the communication path for an amount of time in order to produce delayed data. The amount of time for the delay is equal to the difference between the start of the cycle for receiving data in a particular channel and the start of the cycle for transmitting data in the particular channel. Further, the channel control memory stores FIFO control and status data for all FIFO queues. The FIFO logic module includes FIFO registers, which are loaded with FIFO control and status data for a single FIFO queue. At any time the single FIFO queue is associated with the current channel of the produced delayed data. The read and write requests for the single FIFO queue are processed contemporaneously using the FIFO registers.

In yet another embodiment, a system for managing a communication path carrying multiple channels in an IC is presented, where each channel includes a FIFO queue. The system includes a buffer, one FIFO data buffer per channel, channel control memory, and read and write FIFO control registers. The buffer introduces a delay in the arriving data in the communication path, resulting in delayed data. The time delay is equal to the difference between the start of the cycle for receiving data in a particular channel and the start of the cycle for transmitting data in the same particular channel. The delayed data is written to the FIFO data buffer corresponding to the channel associated with the delayed data, and the channel control memory is used for storing FIFO control and status data for all FIFO queues. Further, the read and write FIFO control registers hold the FIFO control and status data for the FIFO queue that corresponds to the channel associated with the delayed data. Read requests are processed contemporaneously with write requests for the same channel, where the read and write requests are performed based on the read and write FIFO control registers and based on the FIFO data buffer that corresponds to the channel associated with the delayed data.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe methods, apparatus, and computer programs for managing a communication path carrying multiple channels, where each channel includes a First-In First-Out (FIFO) queue. In one embodiment, a Memory Logic Array Block (MLAB) is used to store the FIFO control and status registers of both the write and the read sides of each channel. The control and status registers are read and processed when the registers are requested at the output. To process the same channel simultaneously on the write and read sides, the write and read registers have to be aligned. To align the write and read side, a delay buffer is inserted at the FIFO input side.

Since only one FIFO processing engine is used for all the channels, the use of memory is very efficient in terms of power and cost. In addition, the required amount of resources is greatly reduced. It should be appreciated that as the higher the number of channels increases, the savings will likewise increase.

It will be obvious, however, to one skilled in the art, that the present invention may be practiced without some or all of these specific details. In other instances, well known process operations have not been described in detail in order not to unnecessarily obscure the present invention.

Figure 1:
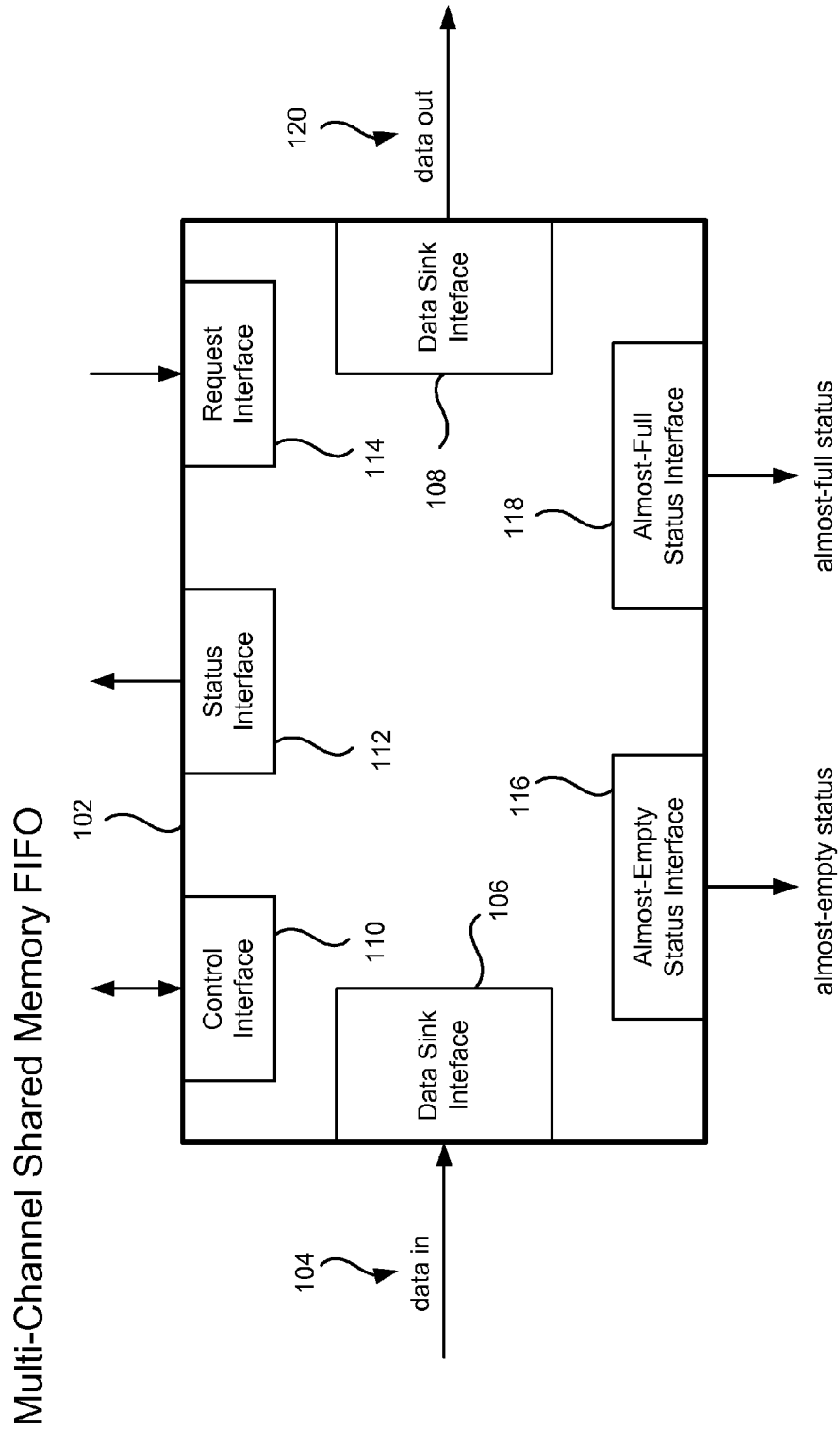
FIG. 1 depicts one embodiment of an architecture for a multi-channel shared-memory First-In First-Out (FIFO) module.

FIG. 1 depicts one embodiment of an architecture for a multi-channel shared-memory First-In First-Out (FIFO) module 102. One skilled in the art will appreciate that some FIFO modules are available as Intellectual Property (IP) in IC design tools and are provided as off-the-shelf building blocks for IC designers. FIFO module 102 includes data sink interface 106 for arriving data 104 and a data sink interface 108 that outputs departing data 120. Control interface 110 allows master peripherals to set and access almost-full and almost-empty thresholds.

Status interface 112 provides the FIFO fill level for a given channel. The FIFO fill level represents the amount of data in the FIFO at any given time. The fill level is available on the read data bus one clock cycle after the read request is received. Further, request interface 114 allows master peripherals to request data for a given channel. One FIFO entry is returned for each request in one embodiment. Additional interfaces are available to provide an alert of possible extreme conditions. Almost-empty status interface 116 provides the almost-empty status flag whenever the FIFO queue has low occupancy, and almost-full status interface 118 identifies when the FIFO queue is close to being filled to capacity.

In one embodiment, FIFO module 102 allocates dedicated memory segments within the FIFO for each channel, and is implemented such that the memory segments occupy a single memory block. The depth of each memory segment is determined by the parameter FIFO depth. If the core is configured to support more than one channel, the request interface 114 is implemented to allow master peripherals to request data for a specific channel. When a request is received on request interface 114, the requested data is available on the data source interface after a predetermined number of clock cycles (e.g. 2-5, although other values are also possible). Packets received on data sink interface 106 are dropped if an error signal is asserted.

If FIFO module 102 supports multiple FIFO queues, the amount of resources required grows as the number of FIFO queues grows. In one embodiment, a 12 channel module uses 1741 Adaptive Lookup Tables (ALUTs) and 1028 registers. It should be appreciated that the embodiment illustrated in FIG. 1 is an exemplary form of a multi-FIFO implementation. Other embodiments may utilize different interfaces, or a different number of flags and pins. The embodiment illustrated in FIG. 1 should therefore not be interpreted to be exclusive or limiting, but rather exemplary or illustrative.

Figure 2:
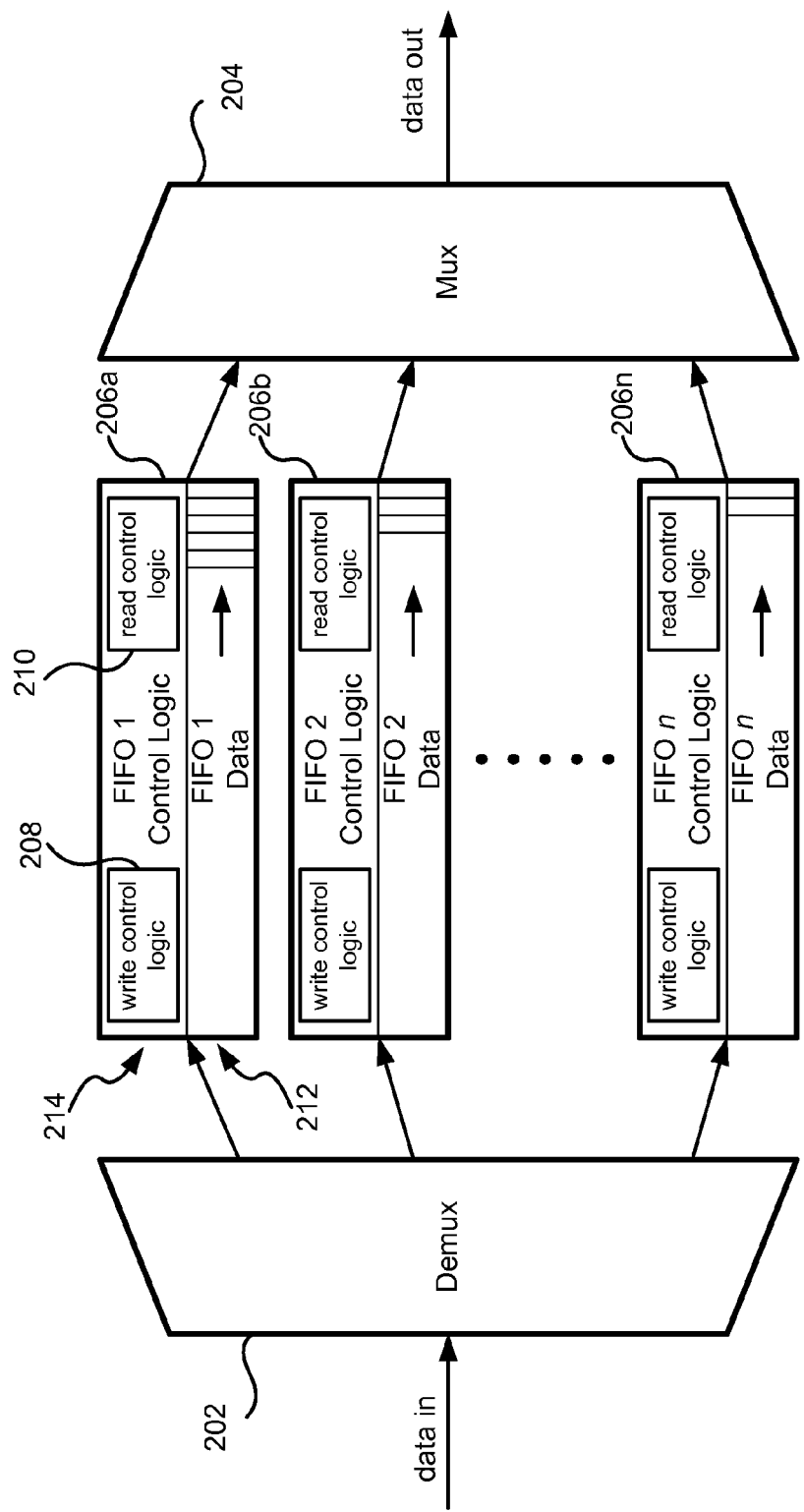
FIG. 2 illustrates an implementation of a multi-channel communication path with multiple independent FIFO queues, according to one embodiment.

FIG. 2 illustrates an implementation of a multi-channel communication path with multiple independent FIFO queues, according to one embodiment. FIG. 2 includes data being received at demultiplexor 202 and then distributed to the different FIFO queues 206a-206n. In another embodiment, the data arrives at each FIFO queue from a different source, and the data is not passed through demultiplexor 202 before processing. On the exit side, the departing data is delivered from FIFO queues 206a-206n to multiplexor 204, which combines the data from all the queues to generate a single communication channel with data embedded from all the sub-channels corresponding to the FIFO queues. For example, 16 voice channels can be combined to be carried over one physical link to a remote destination using TDM.

Since the FIFO queues buffer the data, processing the arriving data (data in) is independent from processing the departing data (data out), and the two processes can be performed simultaneously. This means that at any given time, data may be arriving at the FIFO of one channel while data is departing from the FIFO of a different channel.

Each FIFO queue includes data buffer 212, which holds the data in the communication channel, and FIFO control logic 214, which includes data associated with the management of the FIFO queue. In one embodiment, the data in data buffer 212 is held in a circular buffer, and the FIFO control logic includes head and tail pointers for managing the circular buffer. It should be noted that to maintain the integrity of the circular buffer, any control process that performs a read or a write operation to the FIFO queue must know both head and tail pointers in order to avoid undesired effects, such as over-riding the circular buffer to write over valid data in the buffer, or reading data from an empty buffer.

The values of the head and tail pointers are checked to determine if the buffer is full or empty, or another reported state, such as almost-empty or almost-full. The architecture depicted in FIG. 2 requires a large amount of logic to be implemented in the core of an IC because each FIFO queue needs its own logic for managing the FIFO queue. Embodiments described below show how the amount of logic required can be greatly decreased by using a single FIFO control logic engine shared by all channels.

It should be appreciated that embodiments illustrated in this application use a FIFO queue for data buffering, but principles of the invention can also be applied to other types of buffers, such as Last-In First-Out (LIFO), hot potato, priority queues, etc. Additionally, other embodiments may utilize different data structures besides circular queues, such as hash data structures, stacks, etc. The embodiments illustrated should therefore not be interpreted to be exclusive or limiting, but rather exemplary or illustrative.

Figure 3:
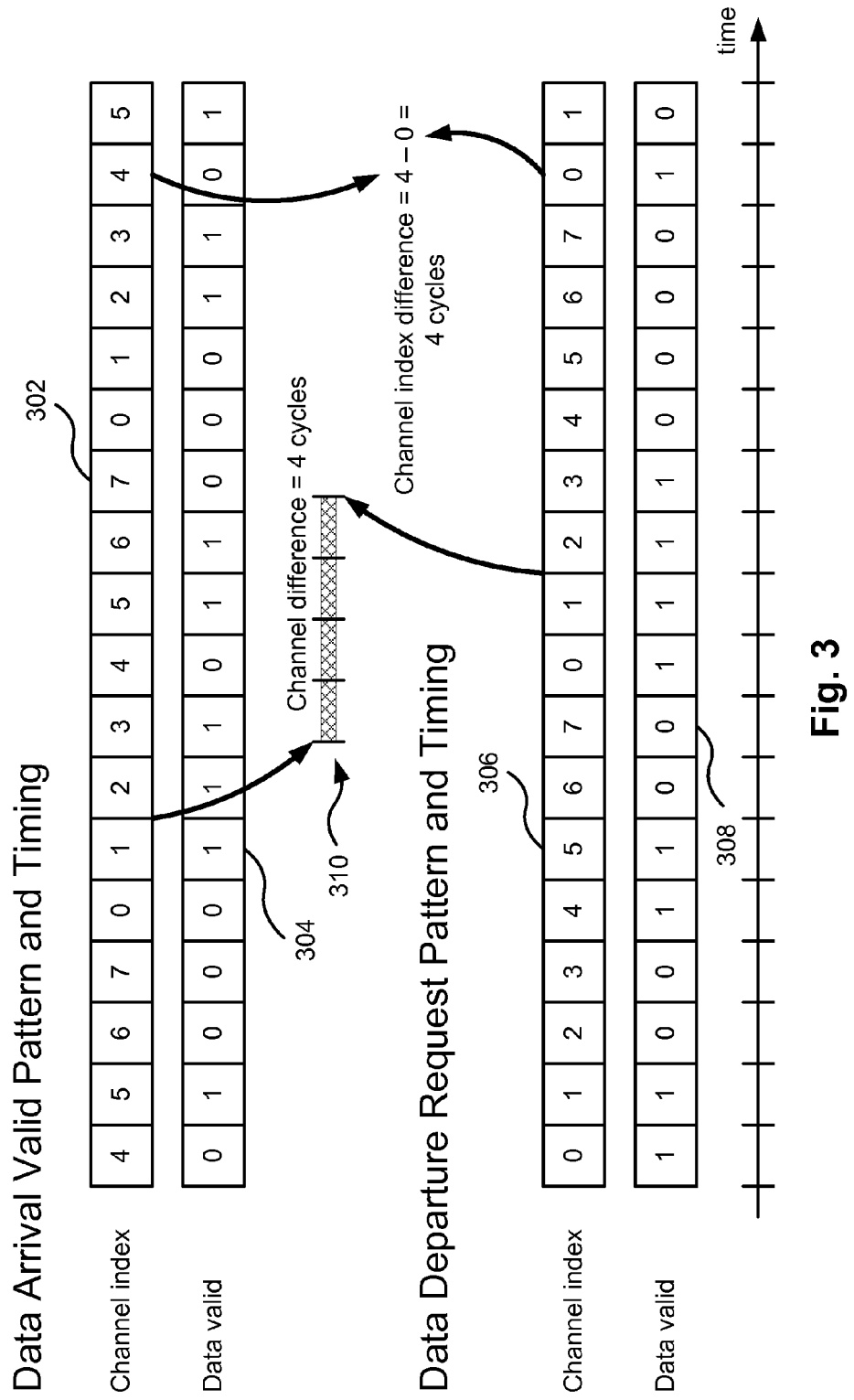
FIG. 3 illustrates channel data processing and timing.

FIG. 3 illustrates channel data processing and timing. In some communication systems, data has to be buffered and aligned with a certain strobe or clock. For example, when a signal has to change from one sample rate to another sample rate the time of departure for the data is defined while the time of arrival is not particularly specified. FIG. 3 shows such an example. A phase compensation FIFO or alignment FIFO is necessary to prevent data overrun or under-run in this embodiment.

Channel index 302 represents the arriving-data channel being processed for each time cycle. Data valid 304 indicates during the particular cycle, whether the channel includes actual data for the FIFO queue (1) or if the channel has no data (0). On the departure side, there is channel index 306 and data valid 308 with similar functionality for the departing data. It can be observed that the arrival channel index 302 and data valid 304 signals can be totally unrelated to the departure channel index 306 and data valid signal 308. Additionally, in FIG. 3 the arrival and departure cycles are aligned in time, i.e., they start and end at the same time. In one embodiment, if the arrival and departure cycles are not aligned then additional logic is used to align the arrival and departure cycles. For example, the delay buffer described below in FIGS. 4 and 5 can be used to align arriving and departing cycles.

During operation, there is a delay between the time for processing arriving data for a channel and the time for processing the departure data for the same channel. The amount of delay 310 can be measured as the time difference between the start of a cycle for processing arriving data in a given channel and the next start of a cycle for processing departure data for the given channel. In FIG. 3, delay 310 is calculated as the time difference between the start of the cycle for processing arrival data in channel 2 and the start of the cycle for processing departure data for channel 2. The amount of delay 310 can also be calculated mathematically by subtracting the data arrival channel index from the data departure channel index using modulo subtraction. For example, channel 4 in the arrival data is processed simultaneously with channel 0 of the departure data. Using channel indices, amount of delay 310 is calculated by obtaining the difference between index 4 and index 0, modulo subtraction, which is equal to 4. It should be noted, that in one embodiment, the calculation of the delay takes into account the delay caused by pipelining registers. Additionally, delay 310 is dynamically recalculated over time as any reset or reconfiguration may change the relationship between the data arrival channel index and the data departure channel index.

Figure 4:
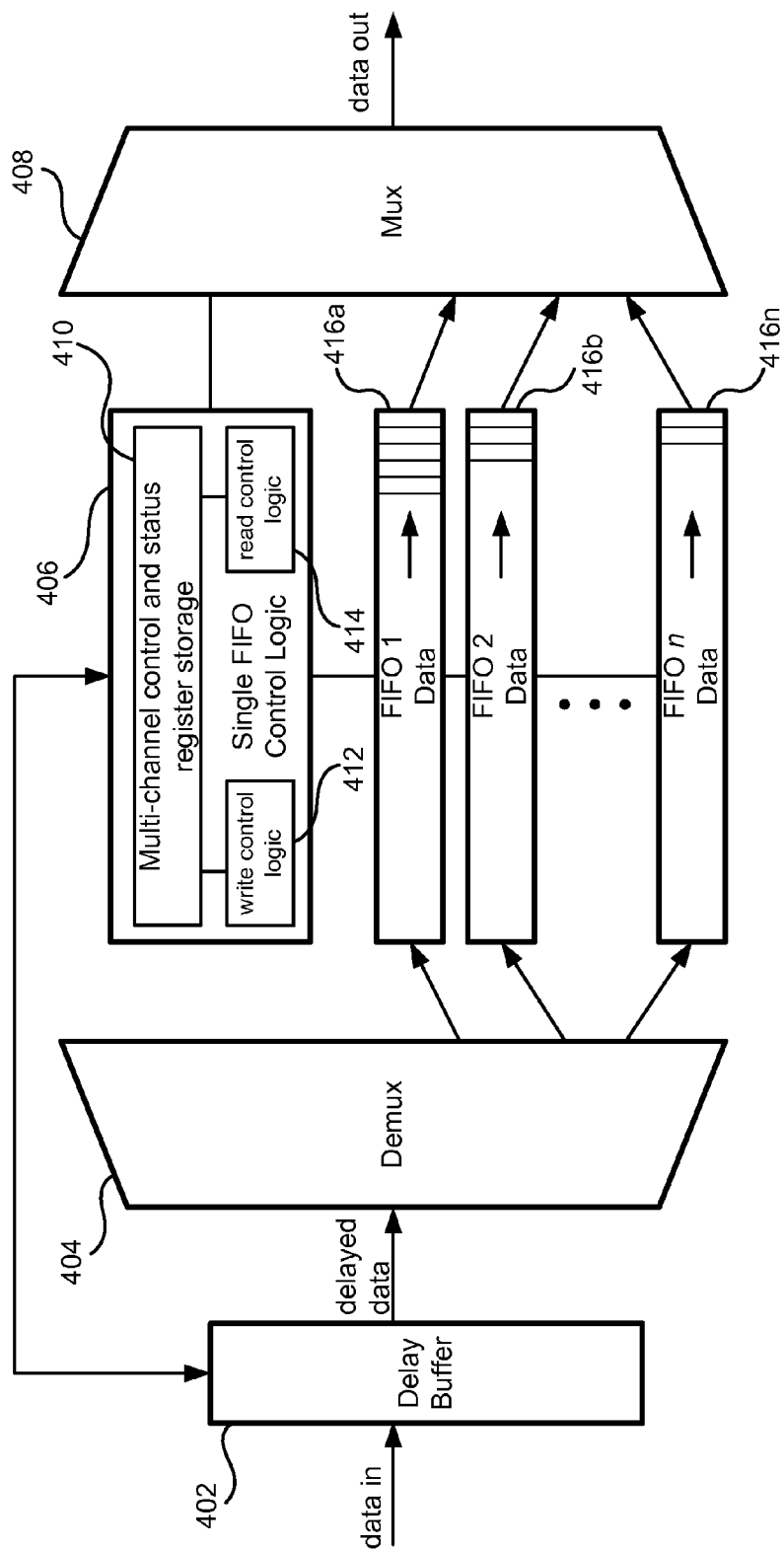
FIG. 4 shows the architecture for managing multiple FIFO queues with a single FIFO control logic module, according to one embodiment.

FIG. 4 shows the architecture for managing multiple FIFO queues with a single FIFO control logic module, according to one embodiment. A single FIFO control logic 406 is used to manage all the FIFO queues 416a to 416n. In order to enable the simultaneous processing of write (input) data and read (output) data, the arriving data is delayed by delay buffer 402. The arriving data is delayed the amount of time required to synchronize the read and write operations of the queues, such that read and write operations act upon the same FIFO queue contemporaneously. The output of delay buffer 402 is referred to herein as delayed data, which is also the input for demultiplexor 404. Since data arrives and departs from one channel at a time, it is possible to have a single FIFO processing engine to process the FIFO control and status one channel at a time.

Each cycle, write control logic 412 and read control logic 414 are loaded from multi-channel control and status register storage 410, which stores in memory all the information required to manage all the FIFO queues. When it is the turn for a channel to be processed, control logic 412 and 414 are loaded from multi-channel control and status register storage 410, and the required read and write operations are performed using the loaded control logic. At the end of the processing cycle for the channel, the current values in control logic 412 and 414 are saved back to register storage 410. Afterwards, in the next cycle, processing for the next channel begins with the loading of the control logic values for the next channel and the process is repeated with the next channel.

In one embodiment, the FIFO control and status registers include the write address (waddr), the write enable (generated from data valid of the write side), the read address (raddr), and the read request (rreq) signals. As long as these four signals are synchronized to the same channel, the rest of the operations on the FIFO queues are the same as the case with independent FIFO control logic.

Because a single FIFO control logic block is used to process all the channels, the resulting multi-channel FIFO is very resource efficient. For example, in a 16-channel data path, the use of a single FIFO control logic means that the control logic registers can be reduced by a factor of 16. The savings can be even greater in a high-capacity channel carrying 1,000 channels or more in the same TDM.

Figure 5:
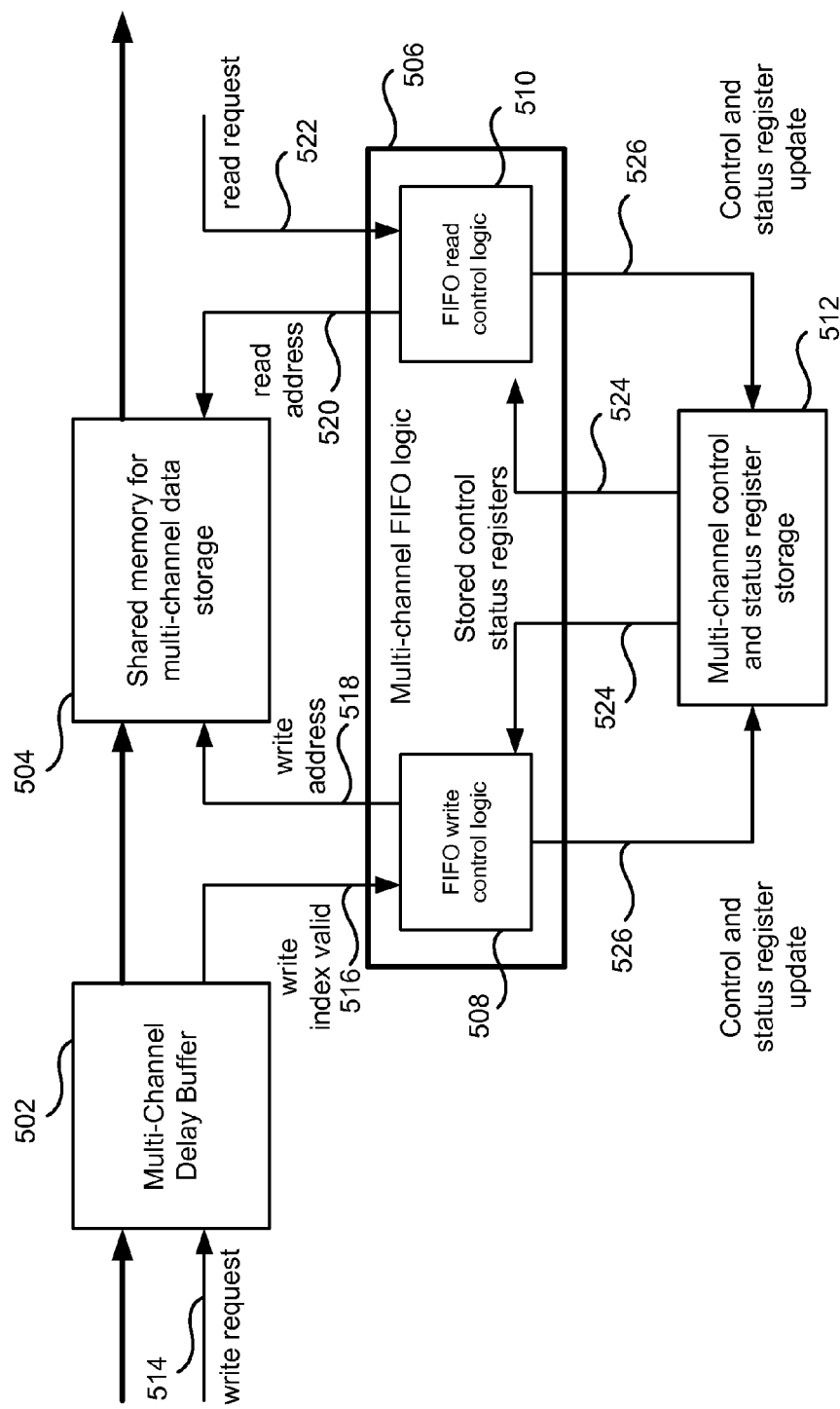
FIG. 5 illustrates the flow of data when using the single FIFO control logic, in accordance with one embodiment of the invention.

FIG. 5 illustrates the flow of data when using the single FIFO control logic, in accordance with one embodiment of the invention. Data arrives to multi-channel delay buffer 502 when a write request 514 is received. The delayed data leaving multi-channel delay buffer 502 is sent to shared memory 504, which holds the data for the FIFO queues 416a-416n of FIG. 4. The departing data in the multi-channel communication path is transmitted from shared memory 504. Placing data in or out of shared memory 504 is done under the control of multi-channel FIFO logic 506, which includes FIFO write control logic 508 and FIFO read control logic 510.

As previously described in reference to FIG. 4, write 508 and read 510 control logic operate on one single FIFO queue at a time. The control and status information for the FIFO queues is kept in memory in multi-channel control and status register storage 512. When a FIFO queue is going to be serviced, multi-channel FIFO logic 506 reads the current values 524 of the stored control and status registers from multi-channel control and status register storage 512. After the pertinent FIFO queue operations have been performed, the current values of the control and status registers are saved back 526 in multi-channel control and status register storage 512.

In order to move the data from multi-channel delay buffer 502 to shared memory 504, multi-channel delay buffer 502 sends a write index valid signal 516 to FIFO write logic 508, and when the data is ready to be transferred FIFO write logic 508 sends write address 518 to shared memory 504 indicating the location where the data will be stored in shared memory 504. Similarly, FIFO read logic 510 sends the read address to shared memory 504 after receiving a read request 522, which is associated with read address 520. In one embodiment the FIFO control and status registers include status registers such as empty, almost empty, full, almost full, read ready, read error, queue ready, etc.

Below is a sample implementation supporting comprehensive FIFO status signals:
  input areset,
  // write side signals
  input clk,
  input [bw_data-1:0] data,
  input data_v, // becomes wrreq, data_v
  input [log 2s(num_of_chs)-1:0] data_c,
  output wr_err,
  output full,
  output almost_full,
  // read side signals
  input [log 2s(num_of_chs)-1:0] rd_c,
  input rd_ack,
  output signed [bw_data-1:0] rd_q,
  output rd_fifo_rdy, // assert when the fifo is filled to a certain threshold
  output rd_err,
  output [log 2s(fifo_depth)-1:0] usedw,
  output empty,
  output almost_empty, It should be noted that because the FIFO read and write control and status logic is shared among all the channels, the FIFO implementation can have a richer set of registers available, such as almost-empty, almost-full, etc., for implementing FIFO functionality without causing an expensive resource penalty. If each channel were to have its own set of registers, then the addition of registers to the FIFO implementation would grow linearly with the number of channels, resulting in bigger register resource requirements. In the embodiment shown in FIG. 5, the number of registers is independent of the number of channels, because only one channel is serviced at a time.

In one implementation for 8 channels, it was observed that the FIFO control logic is about $\frac{1}{7}^{th}$ the size of a straight implementation of independent FIFO queues with their separate control logic. The smaller logic size allows faster compile time, lower power, and higher IC operating frequency $F_{max}$.

Figure 6:
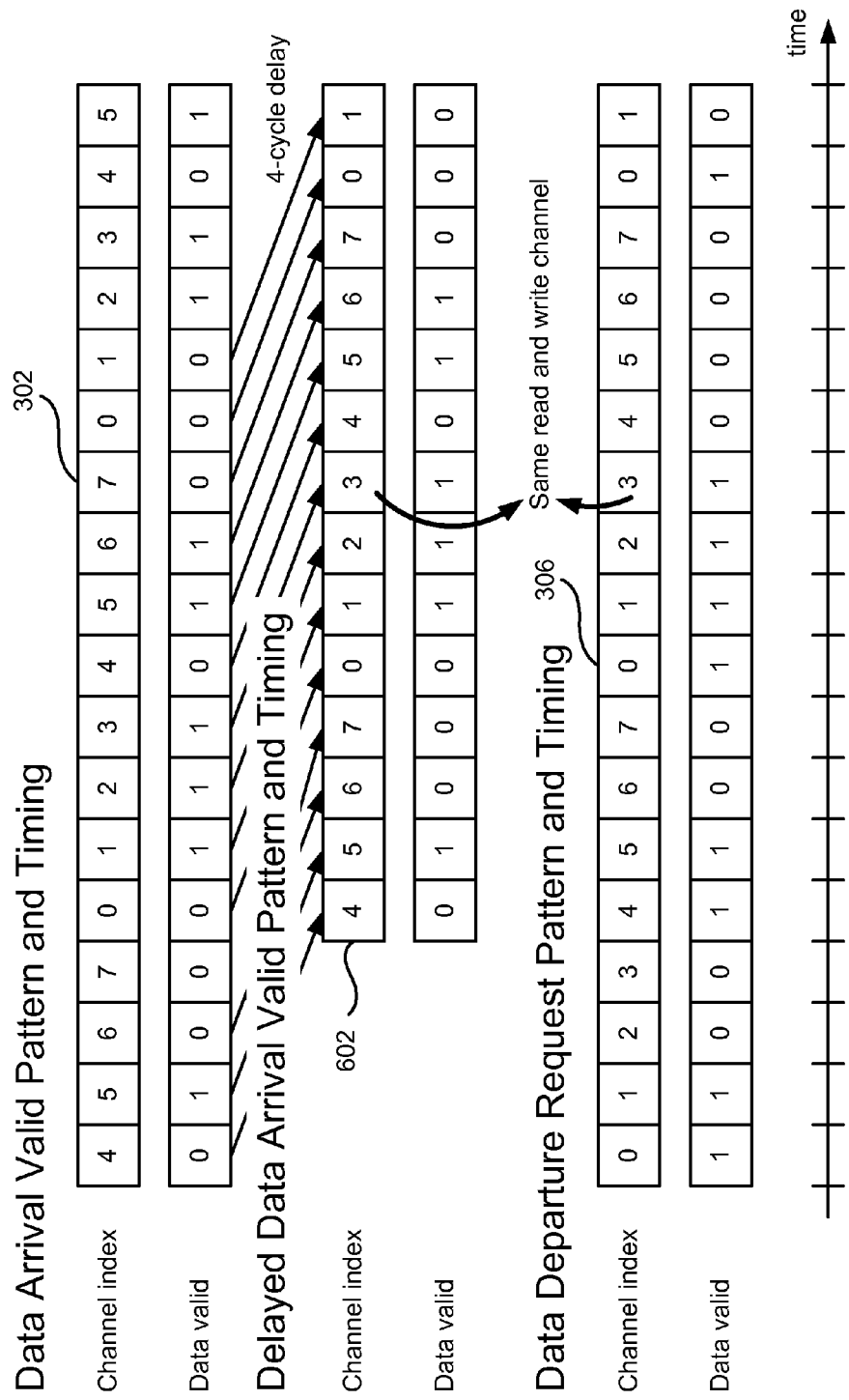
FIG. 6 illustrates an embodiment for aligning arrival and departure data.

FIG. 6 illustrates an embodiment for aligning arrival and departure data. FIG. 6 shows the effect of delaying arrival data 302 previously described in reference to FIG. 3. As described above, a channel difference of 4 cycles existed between the arrival 302 and departure data 306. When arrival data 302 is delayed 4 cycles, e.g. by multi-channel delay buffer 502 of FIG. 5, then delayed data 602 is in channel synchronism with departure data 306. Because the data is synchronized, it is possible to operate on both the write and the read side of each FIFO queue contemporaneously, as seen in FIG. 5.

It should be appreciated that the embodiments illustrated in FIGS. 4-6 are exemplary forms of sharing FIFO registers for processing multiple FIFO queues. Other embodiments may utilize different forms of aligning arrival and departure data, or may implement a different set of directives. In one embodiment, the departure data is delayed to place the departure data in synchronism with the arrival data, and in another embodiment either the arrival data or the departure data can be delayed to obtain the synchronism. The embodiments illustrated in FIGS. 4-6 should therefore not be interpreted to be exclusive or limiting, but rather exemplary or illustrative.

Figure 7:
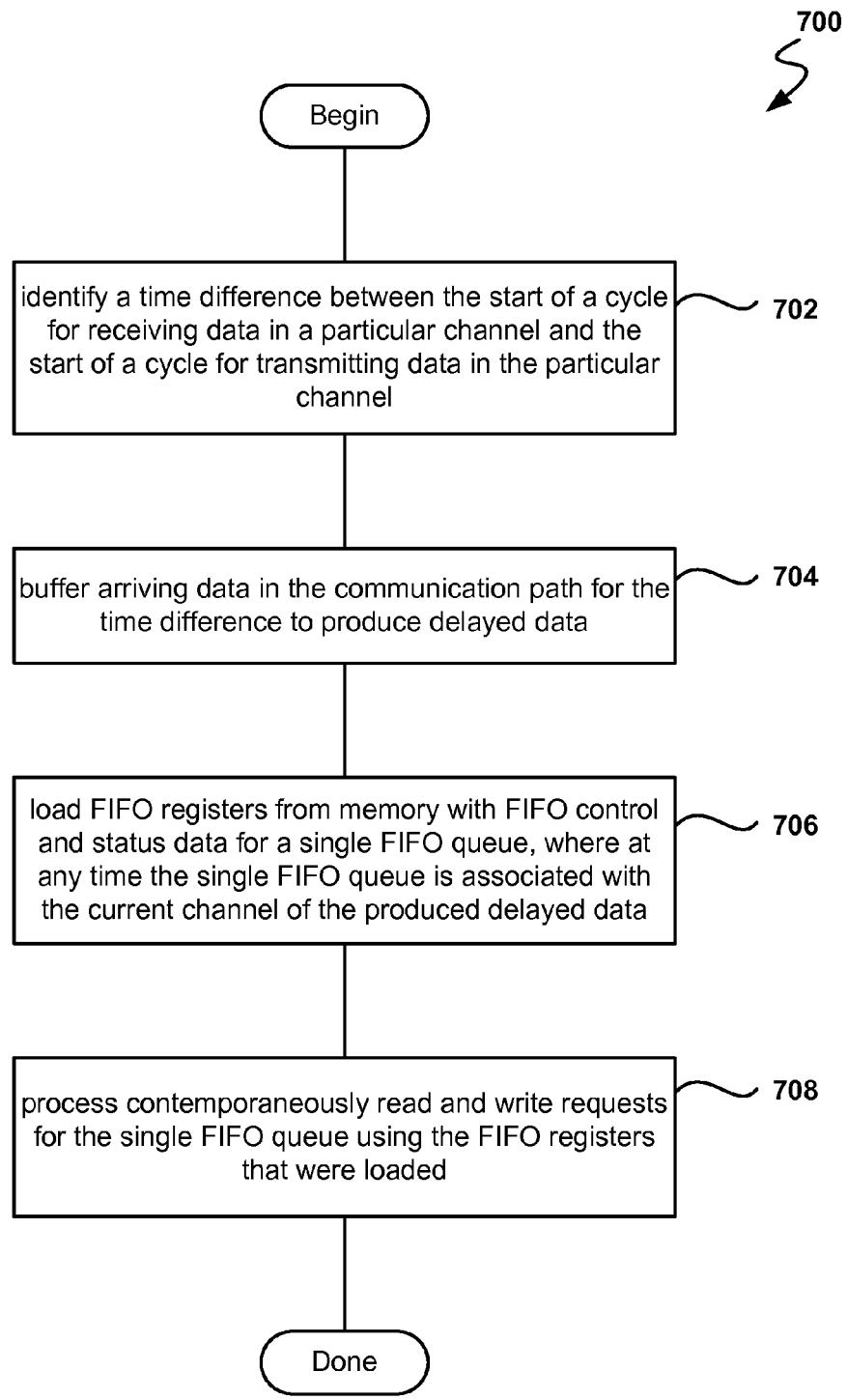
FIG. 7 shows the process flow for managing a communication path carrying multiple channels, according to one embodiment.

FIG. 7 shows process flow 700 for managing a communication path carrying multiple channels, according to one embodiment. In operation 702, the process identifies a time difference between the start of the cycle for receiving data in a particular channel and the start of the cycle for transmitting data in the particular channel. See for example FIG. 3, and the corresponding description, for a method to calculate the time difference.

Further, the method includes operation 704 for buffering the arriving data in the communication path to produce delayed data. The buffering is done for an amount of time equal to the time difference previously identified. The method flows to operation 706, where FIFO registers are loaded from memory. The FIFO registers are loaded with FIFO control and status data for a single FIFO queue, such that, at any time the single FIFO queue is associated with the current channel of the produced delayed data. After operation 706, the method continues to operation 708 where the method processes contemporaneously the read and write requests for the single FIFO queue using the FIFO registers previously loaded.

Figure 8:
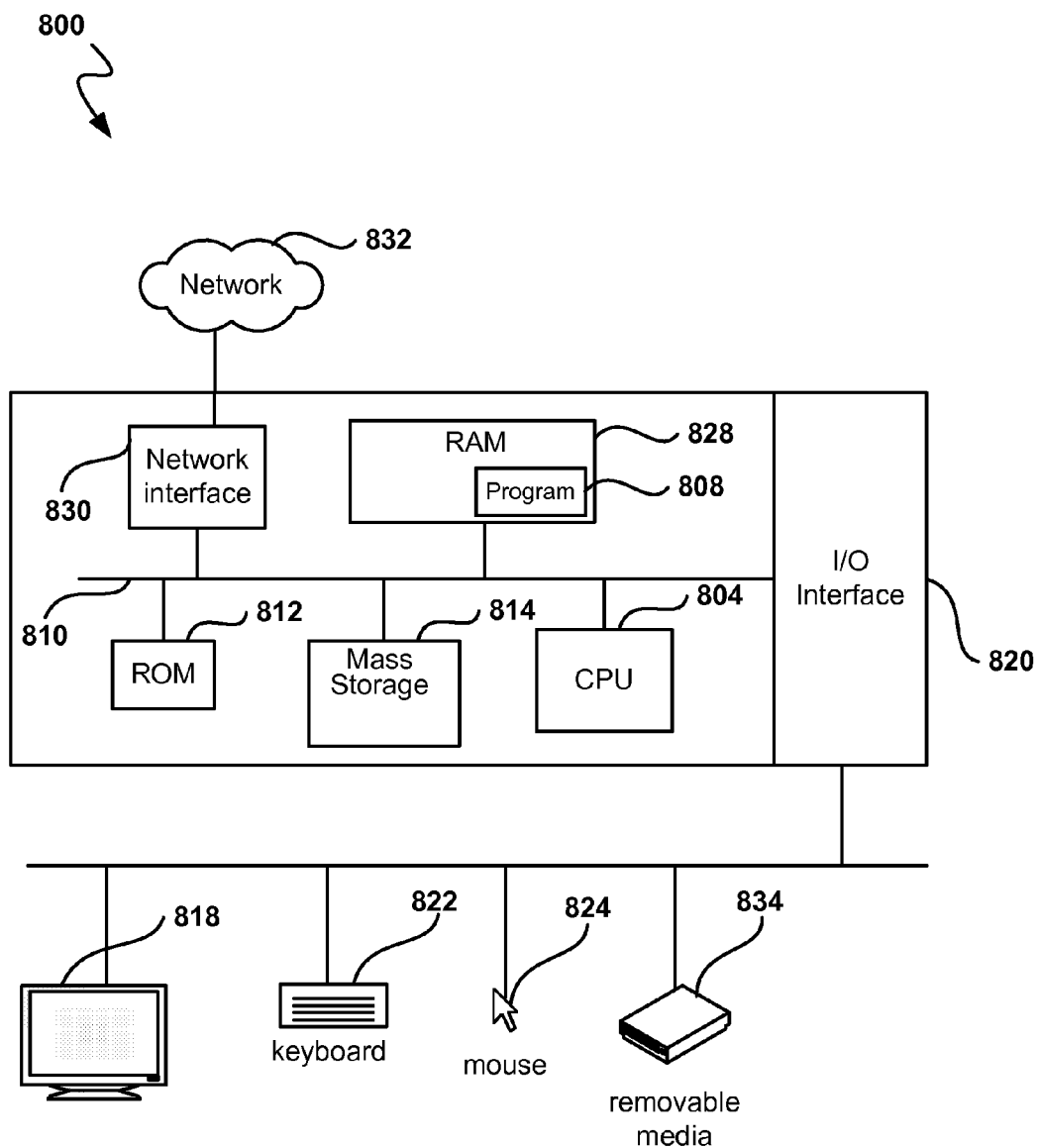
FIG. 8 is a simplified schematic diagram of a computer system for implementing embodiments of the present invention.

FIG. 8 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 828, read-only memory (ROM) 812, and mass storage device 814. Multi-channel FIFO control program 808 resides in random access memory (RAM) 828, but can also reside in mass storage 814. Multi-channel FIFO control program 808 is executed by CPU 804 to implement some embodiments of the invention.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The invention can also be practiced in distributed computing environments where tasks are performed by remote processing devices that are linked through a wire-based or wireless network.

The methods and systems for managing a communication path carrying multiple channels, described herein may be incorporated into any suitable integrated circuit. For example, the methods, and systems may be incorporated into other types of programmable logic devices such as programmable array logic (PAL), programmable logic arrays (PLAs), field-programmable gate arrays (FPGAs), field programmable logic arrays (FPLAs), electrically programmable logic devices (EPLDs), electrically erasable programmable logic devices (EEPLDs), logic cell arrays (LCAs), application-specific integrated circuits (ASICs) just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for managing a communication path carrying multiple channels, each channel including a first-in first-out (FIFO) queue, the method comprising:
   identifying a time difference between a start of a cycle for the communication path receiving data in a particular channel and a start of a cycle for the communication path transmitting data in the particular channel, with the communication path contemporaneously receiving data in the particular channel and transmitting data in a differing channel as a result of a channel difference between arrival data of the communication path and departure data of the communication path, wherein the communication path includes the FIFO queue of each channel, and the communication path further includes a delay buffer, wherein the time difference is at least one clock cycle for the particular channel;
   buffering, via the delay buffer, arriving data in the communication path for the time difference to produce delayed data such that the FIFO queue of each channel has respective arrival data and departure data aligned in channel synchronism, wherein the buffering delays the data in serial form, without parallel writing or parallel reading of the data, for the at least one clock cycle;
   loading FIFO registers from memory, the FIFO registers being loaded with FIFO control and status data for a single FIFO queue, wherein the single FIFO queue is associated with a channel of the produced delayed data; and
   processing contemporaneously read and write requests for the single FIFO queue using the loaded FIFO registers.

2. The method as recited in claim 1, further including:
   storing the FIFO registers in memory after processing the read and write requests; and
   loading the FIFO registers with FIFO control and status data for a next FIFO queue.

3. The method as recited in claim 1, wherein identifying the time difference further includes:
   subtracting from a channel index of arriving data a channel index of delayed data modulo a number of channels.

4. The method as recited in claim 1, wherein all the channels share the FIFO registers, the FIFO registers including registers associated with management of one FIFO queue at a time.

5. The method as recited in claim 1, further including:
   dynamically adjusting the time difference to keep the delayed data synchronized with transmitted data.

6. The method as recited in claim 1, wherein the FIFO registers include FIFO status, the FIFO status selected from a group consisting of empty, almost-empty, full, almost-full, read error, write error, read acknowledgement, or read ready.

7. The method as recited in claim 1, wherein the FIFO registers include head and tail pointers for a circular buffer.

8. The method as recited in claim 1, wherein the communication path operates in time division multiplexing (TDM).

9. The method as recited in claim 1, wherein a read request leaves the corresponding FIFO queue unchanged when the data valid bit is not set.

10. An integrated circuit (IC) for managing a communication path carrying multiple channels, each channel including a first-in first-out (FIFO) queue, the IC comprising:
    a buffer that delays arriving data in the communication path for an amount of time to produce delayed data such that the FIFO queue of each channel has respective arrival data and departure data aligned in channel synchronism, the amount of time being equal to a difference between a start of a cycle for the communication path receiving data in the particular channel and a start of a cycle for the communication path transmitting data in the particular channel, the amount of time at least one clock cycle for the particular channel the data remaining as serial data, excluding parallel writing or parallel reading of the data, throughout the buffer;
    channel control memory for storing FIFO control and status data for all FIFO queues; and
    a FIFO logic module that includes FIFO registers, wherein the FIFO registers are loaded with FIFO control and status data for a single FIFO queue, wherein the single FIFO queue is associated with a channel of the produced delayed data, and wherein read and write requests for the single FIFO queue are processed contemporaneously using the FIFO registers.

11. The IC as recited in claim 10, further including:
    shared data memory for storing arriving data and data being transmitted.

12. The IC as recited in claim 10, wherein the FIFO registers are stored in memory after processing the read and write requests.

13. The IC as recited in claim 10, wherein the FIFO registers include registers associated with management of one FIFO queue at a time.

14. The IC as recited in claim 10, wherein the FIFO registers include FIFO status, the FIFO status being selected from a group consisting of empty, almost-empty, full, almost-full, read error, write error, read acknowledgement, or read ready.

15. An integrated circuit (IC) comprising:
- a buffer that delays arriving data in a communication path for an amount of time to produce delayed data, the amount of time being equal to a difference between a start of a cycle for the communication path receiving data in a particular channel and a start of a cycle for the communication path transmitting data in the particular channel, wherein the amount of time is one or more clock cycles for the particular channel, the buffer configured to delay the data in serial form, with neither parallel writing of the data nor parallel reading of the data, for the one or more clock cycles;
- one FIFO data buffer per channel, the delayed data being written to the FIFO data buffer that corresponds to the channel associated with the delayed data so that the delayed data is aligned to departure data of the FIFO data buffer in channel synchronism;
- channel control memory for storing FIFO control and status data for all FIFO queues; and
- read and write FIFO control registers that are loaded with FIFO control and status data for the FIFO queue that corresponds to the channel associated with the delayed data, wherein read requests are processed contemporaneously with write requests for a same channel.

16. The IC as recited in claim 15, further including:
- a multiplexor for distributing delayed data to the corresponding FIFO data buffer.

17. The IC as recited in claim 15, further including:
- a demultiplexor for combining departing data from the FIFO data buffers.

18. The IC as recited in claim 15, wherein the read and write requests being performed based on the read and write FIFO control registers and the FIFO data buffer that corresponds to the channel associated with the delayed data, and wherein the FIFO control registers include head and tail pointers for a circular buffer.

19. The IC as recited in claim 15, wherein the communication path operates in time division multiplexing (TDM).

20. The IC as recited in claim 15, wherein the amount of time is calculated based on a modulo subtraction of a channel index of arriving data from a channel index of the departure data, the modulo being of the number of channels.

* * * * *